(12) United States Patent
Küssel et al.

(10) Patent No.: US 6,358,315 B1
(45) Date of Patent: Mar. 19, 2002

(54) METHOD AND APPARATUS FOR PRODUCING MONOCRYSTALS

(75) Inventors: Eckhard Küssel, Düren; Thomas Bünger, Chemnitz; Tilo Flade; Berndt Weinert, both of Freiberg; Klaus Sonnenberg, Niederzier, all of (DE)

(73) Assignees: Freiberger Compound Materials GmbH; Forschungszentrum Jülich GmbH, both of Jülich (DE)

( * ) Notice: Subject to any disclaimer, the term of this patent is extended or adjusted under 35 U.S.C. 154(b) by 0 days.

(21) Appl. No.: 09/526,768

(22) Filed: Mar. 16, 2000

(30) Foreign Application Priority Data

Mar. 19, 1999 (DE) .......................................... 199 12 486

(51) Int. Cl.⁷ .............................................. C30B 13/02
(52) U.S. Cl. .......................................................... 117/81
(58) Field of Search ...................................... 117/81, 83

(56) References Cited

U.S. PATENT DOCUMENTS 5,400,742 A * 3/1995 Nishio et al. ............... 117/223
5,685,907 A * 11/1997 Fujikawa et al. ........... 117/205
6,007,622 A * 12/1999 Kawase et al. .............. 117/82

FOREIGN PATENT DOCUMENTS

| DE | 197 40 257 A1 | 3/1999 |
| EP | 0 570 610 A1 | 11/1993 |
| EP | 0 671 490 A1 | 9/1995 |
| EP | 0 744 476 A2 | 11/1996 |
| JP | 0030054184 | 3/1991 |
| JP | 06298588 | 10/1994 |

OTHER PUBLICATIONS

J. Amon, et al.; "Analysis of types of residual dislocations in the VGF growth of GaAs with extremely low dislocation density"; 1999 Elsevier Science; pp. 367–373; 198/199; 1999.

* cited by examiner

*Primary Examiner*—Felisa Hiteshew
(74) *Attorney, Agent, or Firm*—George W. Neuner; William J. Daley; Dike, Bronstein, Roberts and Cushman, Intellectual Property Practice Group

(57) ABSTRACT

In a method and an apparatus for producing monocrystals, in particular of gallium arsenide monocrystals, the crystal growth is carried out with a thermal shock resistant nucleus which is freely standing within a nucleus channel and the interspace in the nucleus channel between the nucleus and the crucible is filled with liquid boric oxide.

16 Claims, 1 Drawing Sheet

METHOD AND APPARATUS FOR PRODUCING MONOCRYSTALS

BACKGROUND OF THE INVENTION

The invention relates to a method and an apparatus for producing monocrystals by cooling a melted mass of a source material for the monocrystal. Specifically, the invention relates to a method for producing monocrystals of different materials, for example III-V-materials such as gallium arsenide, of large diameter.

Methods for producing monocrystals of different materials, for example III-V-materials such as gallium arsenide (GaAs) are known. The known methods for producing various III-V-monocrystals are disadvantageous in that the form fit of the crystal nucleus required for establishing the crystal orientation in a small diameter portion of the crucible often causes the crystal nucleus to contact the inner wall of the crucible. As a consequence the surface of the nucleus cannot be sufficiently covered with oxidic melted mass, thereby allowing the group of the V-component to evaporate.

The evaporated material condenses in an uncontrolled manner at colder places of the reaction system and freely crystallises thereat. The surface of the nucleus is enriched with the III-valuant components whereby the growth of the monocrystal is prevented. These free crystallites and the decomposed nucleus, respectively, act as additional crystallisation nuclei causing polycrystalline growth. Moreover, the direct contact of the nucleus with the wall of the crucible can result in a local deformation and destruction of the nucleus owing to forces arising from different expansion co-efficients of the materials. This also occurs whenever the layer of boric oxide is not entirely and completely fitted around the grown monocrystal. The result is an undesired crystal orientation and therefore a total loss of the required product. In order to avoid an uncontrolled orientation of the crystal it is required to completely cover the crystal nucleus and the crystal itself with the oxidic melted mass.

Known methods for reducing the dislocation density include the use of nuclei with few dislocations. However, such nuclei are susceptible to thermally induced stresses which may destroy a nucleus by producing additional dislocations. To make a nucleus more resistant against thermally induced stresses it can be imagined to keep the temperature gradient at the place of nucleation very small. The consequence is however, that the position of the place of nucleation is uncertain because of the existing fluctuations. Furthermore, this increases the process time because one is forced to keep low the super heat of the reaction space for supplying the melting heat of the solid base material. With the known method the production of monocrystals of different III-V-materials such as gallium arsenide with large diameter, for example 100, 150 or 200 mm, is not possible or requires a disproportionately high expense.

It is known from documents EP 0 744 476 A2 and EP 0 671 490 A1 to cover, in a first step proceeding the process of crystal growth, the inner wall of the crucible with a solid layer for preventing the direct contact between the boron nitride crucible and the nucleus. However, there is the risk that this layer chips off when the nucleus is introduced into the crucible, because the layer cannot in generally be safely attached to the crucible.

OBJECTS OF THE INVENTION

It is the object of the invention to provide an improved method and apparatus for producing monocrystals of different III-V-materials. It is a further object of the invention to provide a method and an apparatus for producing monocrystals of different III-V-materials such as gallium arsenide having a large diameter and few dislocations with high quality in a simple manner.

SUMMARY OF THE INVENTION

In order to achieve the above mentioned objects the invention provides an apparatus for producing a monocrystal by cooling a melted mass of a source material for the monocrystal, the apparatus comprising a crucible for receiving the melted mass, the crucible having a first portion with a first cross-sectional area and a second portion with a second cross-sectional area which is smaller than the first cross-sectional area, the second portion forming a nucleus channel with an inner wall, a nucleus having a first part with a first cross-sectional area and a second part with a second cross-sectional area which is smaller than said first cross-section area, the nucleus being disposed in the nucleus channel of the crucible with the second part being aligned with the second portion of the crucible, and an interspace between the inner wall of the nucleus channel and at least the second part of the nucleus whereby the second part of the nucleus is freely standing within the nucleus channel.

According to a further aspect the invention provides a method for producing a monocrystal by cooling a melted mass of a base material for the monocrystal using the above defined apparatus and comprising the step of filling only the interspace between the inner wall of the nucleus channel and the smaller cross-sectional second part of the nucleus with a liquid oxidic melted mass, for example boric oxide ($B_2O_3$).

According to a further aspect the invention provides a method for producing a monocrystal by cooling a melted mass of a base material for said monocrystal comprising using a crystallisation nucleus in a crucible having a nucleus channel, the nucleus being resistant to thermal shocks and having a dislocation density of about 10,000–100,000 dislocations/$cm^2$.

The inventive method, apparatus and nucleus ensure the production of monocrystals of different III-V-materials of large diameter with a high yield. It is therefore possible to produce gallium arsenide monocrystals having a diameter of 2", 3", 100 mm, 125 mm, 150 mm, 200 mm and greater in good quality. The manufacturers of semiconductor components are therefore provided with a product which fully meets the high requirements for such semiconductor components. The yield obtained in crystal growth is considerably improved by the inventive method.

BRIEF DESCRIPTION OF THE DRAWINGS

Further advantages, features and objects of the invention will be apparent from the following description of an embodiment with reference to the figures, wherein.

DESCRIPTION OF A PREFERRED EMBODIMENT

Figure 1:
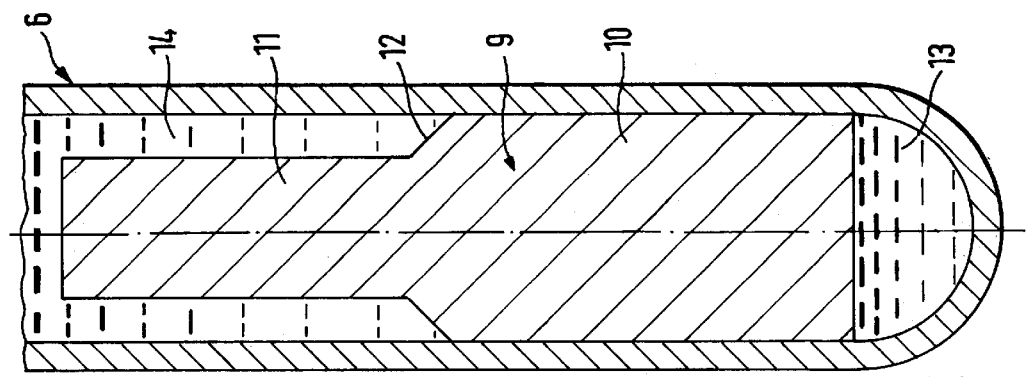
FIG. 1 is a cross-section through an apparatus for producing a gallium arsenide monocrystal in a schematic representation.

The apparatus comprises a crucible 1 having an upper edge 2 and a bottom end 3. The crucible further comprises a cylindrical first portion 4 having an inner diameter which corresponds to the diameter of the monocrystal to be grown and a length corresponding substantially to the length of the monocrystal to be grown. Adjacent to the first portion 4 the crucible 1 comprises a second portion 5 which conical tapers towards the bottom end 3 and forms a transition region of the crystal growth. Following the second portion 5 the crucible 1 comprises a third cylindrical portion 6 having a smaller inner diameter than the first portion 4 and a closed bottom. The third portion 6 forms the nucleus channel. The inner diameter of the nucleus channel is about 8 mm. Preferably, the crucible is a boron nitride crucible (BN-crucible) or a pyrolytic boron nitride crucible (pBN-crucible).

The crucible 1 is disposed in a furnace 7 which is schematically indicated in FIG. 1. The furnace 7 comprises a plurality of superimposed annular heating elements 8 surrounding the crucible 1 in vertical direction from the nucleus channel to its upper edge. A control device, not shown in FIG. 1, for controlling the heating elements 8 is adapted to control the heating elements 8 so as to establish a vertical temperature gradient having a high temperature at the upper edge of the crucible and a low temperature in the region of the nucleus channel.

Figure 2:
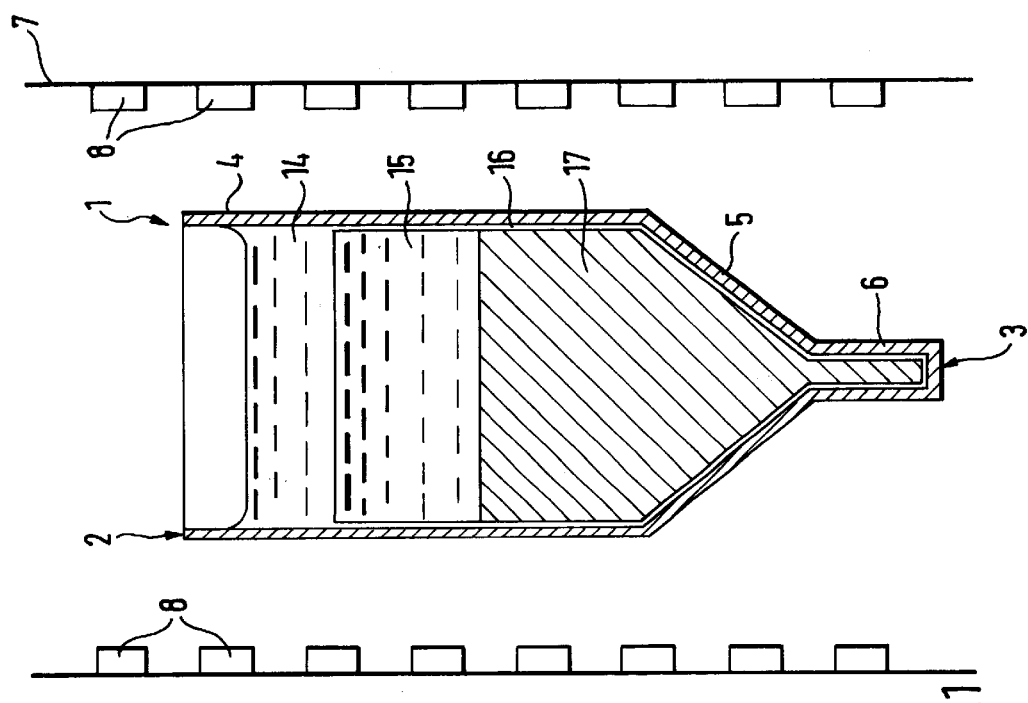
FIG. 2 is a cross-section of the lowermost portion of the crucible of FIG. 1 with a nucleus placed therein in a schematic representation.

As shown in FIG. 2, an inventive crystal nucleus 9 comprises a first cylindrical part 10 having a diameter which closely fits the nucleus channel 6 and a second cylindrical part 11 having a smaller diameter. Preferably, the length of the second part 11 is about half of the total length of the crystal nucleus. The total length of the crystal nucleus is slightly less than the total length of the nucleus channel. A transition portion 12 between the first portion 10 and the second portion 11 is preferably conical. The nucleus 9 is disposed in the nucleus channel so that the second part having a smaller diameter is at the side of the nucleus 9 facing the monocrystal to be grown. The bottom of the nucleus channel is slightly spaced from the first part 10 of the crystal nucleus so as to form a pace 13 which is filled with boric oxide.

Neither the BN-crucible 1 nor the crystal nucleus 9 are provided with an additional protection layer formed before the actual process of crystal growth. It is therefore impossible that any protection layer chips off during the process.

The crystal nucleus 9 is firmly and centrally received with form-fit in the nucleus channel 6 whereby any contact of the crystal nucleus 9 and the region of the smaller diameter second part, i.e. the place where the actual crystallisation occurs, is prevented. It is therefore excluded that crystal nucleus 9 is crushed during the following process steps. This is further improved by making the crystal nucleus 9 shorter than the nucleus channel 6, whereby unmelted polycrystalline materials are prevented from pressing onto the crystal nucleus 9 in the starting phase.

Preferably, the crystal nucleus 9 is a nucleus resistant to thermal shocks and having a high dislocation density of about 100,000 dislocations/cm$^2$.

In the inventive method first a conventional cylindrical crystal nucleus having a length of about 40 mm and a diameter of about 8 mm is thinned in the second part to a diameter of 6 mm over a length of about 20 mm. Thereupon the crystal nucleus 9 is inserted into the third portion 6 of the crucible forming the nucleus channel. Thereafter boric oxide $B_2O_3$, for example in pill form, is placed on the crystal nucleus 9. The boric oxide used has a water content of about 0–2, 500 ppm. Then polycrystalline gallium arsenide, the source material for crystal growth, is added.

At the start of the crystal growth the boric oxide is therefore between the crystal nucleus 9 and the polycrystalline source material.

Subsequently the heating elements 8 are controlled as to melt the boric oxide and the polycrystalline gallium arsenide. The liquid boric oxide 14 flows into the interspace between the wall of the nucleus channel and the thinned part 11 of the crystal nucleus 9 and therefore covers that region of the crystal nucleus which is relevant for crystal growth and faces the source material. The load of the overlying polycrystalline gallium arsenide safely presses the boric oxide between the nucleus and the wall of the crucible during the melting process. Liquid boric oxide 14 is always between the crystal nucleus and the wall of the nucleus channel during the heating phase as well as during crystal growth and prevents a contact of the nucleus with the wall of the nucleus channel. This enables the crystal nucleus to stand freely in the nucleus channel. Since the melting place is in the free standing region of the crystal nucleus the coverage of the melting place by boric oxide prevents the partial destruction of the crystal nucleus at the melting place and the growing crystal "floats" in boric oxide during the entire production process, whereby monocrystals with few dislocations and high quality can be produced.

During the phase of heating the gallium arsenide required for producing the monocrystal the temperature of the nucleus is kept at a low value so as to prevent the nucleus from melting. A corresponding temperature is adjusted by the control device in the region of the nucleus channel.

In the actual process of crystal growth the heating elements 8 are controlled so that the melted mass 15 of gallium arsenide which is covered by the melted mass of boric oxide forming a boric oxide layer 16 at the inner wall of the crucible crystallises at the melting place, i.e. the second part of the crystal nucleus up to the upper edge 2 of the crucible. Since the melted gallium arsenide has a higher density than the boric oxide the boric oxide always accumulates on top of the gallium arsenide, as shown in FIG. 1. Thus, a gallium arsenide monocrystal 17 is formed.

Since a sufficient amount of boric oxide melting far below the melting temperature of GaAs is present between the crystal nucleus 9 and polycrystalline material in the conical portion of the crucible 1 the hydrostatic pressure of the gallium arsenide there above, which is still solid in the start phase of the process of crystal growth, safely urges the liquid boric oxide between the thinner part 11 of the crystal nucleus 9 and the crucible and between the still solid polycrystalline body of gallium arsenide and the crucible 1. Thereby the thinned part 11 of the crystal nucleus 9 and the liquid gallium arsenide is completely enveloped. This results, under typical conditions of monocrystal growth, to a growth which is monocrystalline by 100%.

Furthermore, in the starting phase the liquid boric oxide in the tapering conical portion 5 of the crucible protects the surface of the crystal nucleus 9 against thermal destruction. No arsenide may leave or enter the crystal nucleus 9 as vapour which would create unstoichiometric regions representing sources of polycrystalline growth.

It is preferable, to achieve a save nucleation position, to keep the temperature gradient as large as possible. However, this immediately causes a higher superheat of the polycrystalline material and the melted mass formed thereby, which damages a crystal nucleus having a low dislocation density due to the thermal shock. The dislocation density can be lowered towards zero in the vertical gradient freeze process if a crystal nucleus 9 is used which is resistant to thermal shocks, i.e. if the dislocation density is not locally increased in the nucleation process.

Surprisingly a preceding specific temperature treatment of the crystal nucleus so as to generate 10,000–100,000 dislocations/cm² with uniform distribution prevents any uncontrolled progression of dislocations in the crystal nucleus, i.e. any change of the dislocation density and of the arrangement of the dislocations by influence of a temperature gradient along the nucleus. Thus, by choosing an appropriate temperature gradient the melted mass of gallium arsenide can be transformed into a monocrystal having a low dislocation density.

The direct thermal load on the crystal nucleus 9 can be further reduced through the liquid boric oxide therebetween. It prevents the superheated polycrystalline gallium arsenide from dropping directly onto the cooler crystal nucleus 9 rather than being cooled to the temperature of the nucleus on its way through the liquid boric oxide.

The inventive method can be carried out with any apparatus and applied to any method using a covering melted mass of boric oxide. The crucible needs not be cylindrical but can have any other shape, for example a square cross-section.

Although the invention has been described with reference to a specific example embodiment it is to be understood that it is intended to cover all modifications and equivalent within the spirit and scope of the appended claims.

What is claimed is:

1. An apparatus for producing a monocrystal by cooling a melted mass of a source material for said monocrystal, the apparatus comprising;

a crucible for receiving said melted mass, said crucible having a first portion with a second cross-sectional area and a second portion forming a nucleous channel with an inner wall, a nucleus having a first part with a first cross-sectional area and a second part with a second cross-sectional area, which is smaller than said first cross-section area, the nucleus being disposed in the nucleus channel of the crucible with the second part being aligned with the second portion of the crucible, an interspace between said inner wall of said nucleus channel and at least said second part of said nucleus whereby said second part of said nucleus is freely standing within said nucleus channel.

2. The apparatus of claim 1, wherein said first part and said second part of said nucleus are both cylindrical and have a first and second diameter, respectively, the second diameter being smaller than the first diameter and the first diameter corresponding to the diameter of said nucleus channel for insertion of said nucleus into said nucleus channel in a play-free fit.

3. The apparatus of claim 1, wherein said nucleus comprises a third part between said first part and said second part, the third part forming a transition between said first part and said second part.

4. The apparatus of claim 1, wherein said nucleus comprises a dislocation density of about 10,000–100,000 dislocations/cm².

5. The apparatus of claim 1, comprising heating means and a control device for said heating means for producing a defined temperature gradient between said second portion of said crucible and said first portion of said crucible for melting said second part of said nucleus by about 50%.

6. The apparatus of claim 1, wherein said first part of said nucleus has a sufficient length for safely fastening said nucleus within said nucleus channel.

7. The apparatus of claim 1, wherein said crystal nucleus has a total length which is slightly smaller than a total length of said nucleus channel.

8. A method for producing monocrystals by cooling a melted mass of a source material, the method comprising using the apparatus of claim 1 and the step of filling only said interspace between said second part of said nucleus having the smaller cross-area and said inner wall of said nucleus channel with a liquid oxidic melted mass, for example boric oxide.

9. The method of claim 8, comprising using a crystal nucleus which is resistant to thermal shocks.

10. The method of claim 9, comprising using a crystal nucleus having a dislocation density of about 10,000–100,000 dislocations/cm².

11. The method of claim 8, comprising using a crucible which has a conically flaring portion adjacent to said nucleus channel, the melting oxide (for example boric oxide) prevailing in said conical portion of said crucible at the beginning of crystal growth completely filling the region between the inner wall of said nucleus channel and the thinned part of said nucleus.

12. The method of claim 8, comprising using a monocrystalline nucleus and a corresponding source material for producing a monocrystal.

13. The method of claim 8, comprising using a III-V-composite semiconductor crystal nucleus and a III-V-composite semiconductor source material for producing a III-V-composite semiconductor monocrystal.

14. The method of claim 8, comprising using a gallium arsenide crystal nucleus and a gallium arsenide source material for producing a gallium arsenide monocrystal.

15. A method for producing a monocrystal by cooling a melted mass of a source material, comprising using a crystal nucleus provided within a crucible having a nucleus channel, the crystal nucleus being resistant to thermal shocks and having a dislocation density of about 10,000–100,000 dislocations/cm².

16. The method of claim 15, comprising using a gallium arsenide crystal nucleus and a gallium arsenide source material for the production of a gallium arsenide monocrystal.

* * * * *